United States Patent
Huang et al.

(10) Patent No.: US 7,285,371 B2
(45) Date of Patent: Oct. 23, 2007

(54) PHOTOSENSITIVE COMPOSITION AND COLOR PASTE

(75) Inventors: Kuo-Tung Huang, Jhudong Township, Hsinchu County (TW); Shi-Deh Chao, Jhonghe (TW); I-Jein Cheng, Changhua (TW); Te-Yi Chang, Bade (TW); Ming-Tzung Wu, Mailiao Township, Yunlin County (TW); Mon-Haw Chang, Bali-Township, Taipei County (TW); Yu-Cheng Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 52 days.

(21) Appl. No.: 11/002,033

(22) Filed: Nov. 30, 2004

(65) Prior Publication Data

US 2006/0115765 A1    Jun. 1, 2006

(51) Int. Cl.
*G03F 7/04* (2006.01)
(52) U.S. Cl. .............................. 430/270.1; 430/281.1; 430/901

(58) Field of Classification Search ............. 430/270.1, 430/281.1, 905
See application file for complete search history.

(56) References Cited

U.S. PATENT DOCUMENTS

| | | | |
|---|---|---|---|
| 5,395,721 A * | 3/1995 | Kato et al. ..................... | 430/49 |
| 6,087,050 A * | 7/2000 | Itano et al. .................... | 430/7 |
| 6,255,034 B1 | 7/2001 | Shimada et al. ......... | 430/281.1 |
| 6,964,840 B2 * | 11/2005 | Nishimura et al. ...... | 430/270.1 |

FOREIGN PATENT DOCUMENTS

JP          2002055224 A       2/2002

* cited by examiner

*Primary Examiner*—Amanda C. Walke
(74) *Attorney, Agent, or Firm*—Thomas, Kayden, Horstemeyer & Risley

(57) ABSTRACT

A photosensitive composition and a color paste for making the photosensitive composition. The photosensitive resin composition comprises a photosensitive resin system; a pigment; a photo-reactive amphipathic molecule; and a solvent. The color paste for making the photosensitive composition comprises the pigment and the photo-reactive amphipathic molecule.

10 Claims, No Drawings

PHOTOSENSITIVE COMPOSITION AND COLOR PASTE

BACKGROUND

The present invention relates in general to a photosensitive composition and a color paste for making the photosensitive composition. More particularly, it relates to a photosensitive composition which is advantageously used for forming a color filter of color liquid crystal display devices.

Photosensitive compositions for manufacture of a color filter array include photoresists for the three primary colors—red, green and blue, and black photoresist for black matrix that surrounds color pixels for improving color contrast. Since the composition is required to have high sensitivity, adhesion to the substrate, chemical resistance and the like, a negative radiation sensitive composition is generally used.

To produce a color filter from a photosensitive composition, a black photoresist is first applied to the surface of a substrate and dried, and then exposed to radiation through a photomask and developed to dissolve unexposed portions with an alkali developer, thereby forming a pixel pattern, the so called black matrix. These steps are repeated for the red, green, and blue photoresists, thereby completing a color filter array.

The negative photosensitive composition generally includes a pigment dispersed in a photosensitive resin system which comprises a resin having an acid functional group such as (meth)acrylic acid, a polyfunctional monomer such as pentaerythritol tri(meth)acrylate, and a photoinitiator such as 1-hydroxycyclohexylphenyl ketone.

When a color filter is formed from such a negative photosensitive composition, however, the following problems arise: (1) an undissolved product (residue or scum) of the composition may remain in unexposed portions during developing, (2) the surface of the color filter is roughened, and (3) having film-lost during developing with the alkali developer. As a result, it is difficult to produce a high-resolution pixel array with sufficient color strength. Thus, an improved photosensitive composition for a color filter is called for.

SUMMARY

According to one aspect of the invention, a photosensitive composition is provided. An exemplary photosensitive composition comprises a photosensitive resin system; a pigment; a photo-reactive amphipathic molecule; and a solvent.

According to another aspect of the invention, a color paste for making a photosensitive composition is provided. An exemplary color paste comprises a pigment; and a photo-reactive amphipathic molecule.

DETAILED DESCRIPTION

Each component constituting the photosensitive composition of the invention will be described here in greater detail. In some embodiments, one or more of the aforementioned problems may be solved by incorporating an amphipathic pigment modifier having a functional group that is photo-reactive. Other objects and advantages of the invention will become apparent from the following description.

The photosensitive composition of the invention includes a photosensitive resin system. Preferably, the photosensitive resin system includes (1) an alkali-soluble resin having an acid functional group such as acrylic acid or methacrylic acid, (2) a polyfunctional monomer containing at least two polymerizable ethylenically unsaturated bonds for forming a crosslinked polymer network, and (3) a photoinitiator which produces active species capable of initiating the polymerization of the polyfunctional monomer. The photosensitive composition preferably comprises the resin system in an amount of 4-12 wt %, more preferably 6-10 wt %, based on the total weight of the composition.

The above alkali-soluble resin is preferably a copolymer of (a) ethylenically unsaturated monomer having a carboxyl group such as acrylic acid, and methacrylic acid, and (b) at least one other ethylenically unsaturated monomer. Preferred examples of the other ethylenically unsaturated monomer include methacrylates such as methyl (meth)acrylate, benzyl (meth)acrylate, ethyl (meth)acrylate, 2-hydroxyethyl (meth)acrylate, hydroxylpropyl (meth)acrylate, and isobutyl (meth)acrylate; and acrylates such as methyl acrylate, benzyl acrylate, ethyl acrylate, 2-hydroxyethyl acrylate, hydroxylpropyl acrylate, and isobutyl acrylate.

These other unsaturated monomers may be used alone or in admixture of two or more. The proportion of the carboxyl-containing monomer in the copolymer is preferably 10 to 50 mol %, more preferably 20 to 40 mol %. The alkali-soluble resin preferably has a weight average molecular weight of 1,000 to 100,000, more preferably 6,000 to 20,000.

The photosensitive resin system of the invention further includes a polyfunctional monomer containing at least two polymerizable ethylenically unsaturated bonds for forming a crosslinked polymer network. Preferred examples of the polyfunctional monomers include ethylene glycol dimethacrylate, 1,4 butanediol diacrylate, diethylene glycol diacrylate, pentaerythritol triacrylate, ethoxylated trimethylpropane triacrylate, dipentaerythritol pentaacrylate, ethoxylated pentaerythritol tetraacrylate, pentaerythritol tetraacrylate, and dipentaerythritol hexaacrylate. These polyfunctional monomers may be used alone or in admixture of two or more.

The photosensitive resin system of the invention further includes a photoinitiator which produces active species capable of initiating the polymerization of the polyfunctional monomer, such as radical, cationic and anionic species, when irradiated with radiation such as visible light, ultraviolet (UV) light, far ultraviolet light, electron beam or X-ray. Preferably, the photoinitiator is UV initiator exhibiting maximum UV absorption at a wavelength below 400 nm.

Preferred examples of the photoinitiators include acetophenone compounds, benzoin compounds, benzophenone compounds, thioxanthone compounds, and anthraquinone compounds. Specific examples of the acetophenone compounds include 2-methyl-1-(4-(methylthio)phenyl)-2-morpholino-propane-1,1-hydroxy cyclohexyl phenyl ketone, diethoxyacetophenone, 2-hydroxy-2-methyl-1-phenyl-propane-1-one, and 2-benzyl-2-(dimethylamino)-1-[4-(4-morpholinyl)phenyl]-1-butanone. Specific examples of the benzoin compounds include benzoin, benzoin methyl ether, and benzyl dimethyl ketal. Specific examples of the thioxanthone compounds include isopropylthioxanthone, and 2-chlorothioxanthone. A specific example of the anthraquinone compounds is 2-ethylanthraquinone.

The above photoinitiator may be used alone or in admixture of two or more. For example, a high initiation speed can be provided by a mixture of isopropylthioxanthone and 2-benzyl-2-(dimethylamino)-1-[4-(4-morpholinyl)phenyl]-1-butanone.

The photosensitive composition of the invention further includes a pigment. The pigment is not limited to a particular color tone and is suitably selected according to the application purpose of the obtained color filter. It may be either organic or inorganic.

Illustrative examples of the organic pigment include compounds classified into the group of pigments according to color index (C.I.; issued by The Society of Dyers and Colourists Co.) and having the following color index numbers, such as Pigment Red 122, Pigment Red 202, Pigment Red 206, Pigment Red 209, Pigment Red 177, Pigment Red 254; Pigment Yellow 13, Pigment Yellow 55, Pigment Yellow 119, Pigment Yellow 138, Pigment Yellow 139, Pigment Yellow 168; Pigment Green 7, Pigment Green 36; Pigment Blue 15:3, Pigment Blue 15:4, Pigment Blue 15:6; and C.I. Pigment Black 1 and C.I. Pigment Black 7.

Illustrative examples of the inorganic pigment include titanium oxide, barium sulfate, calcium carbonate, zinc oxide, lead sulfate, yellow lead, zinc yellow, red iron oxide (III), cadmium red, ultramarine blue, Prussian blue, chromium oxide green, cobalt green, amber, titanium black, synthetic iron black, carbon black and the like.

Of these inorganic black pigments, carbon black is particularly preferred as it provides a superior light blocking efficiency. Commercially available carbon black include LFF-MA7, LFF-MA100, HCF-#2650, and MCF-88 by Mitsubishi Chemical Corporation, Special 4A and FW-18 by Degussa Corp., S90B and Mogul L by Cabot Corp., and RAVEN 1200 and RAVEN 2000 by Columbian Chemical Co. The particle size of the black pigment is generally 0.05 to 0.5 μm, preferably 0.08 to 0.15 μm. When the particle size is less than 0.05 μm, the viscosity of the photosensitive composition may be undesirably high, and the optical density thereof tends to decrease due to increased transmittance. Conversely, when the particle size is more than 0.5 μm, the optical density may also decrease due to poor stability.

The pigment of the invention may be used in combination with a dispersant as required to control the particle size distribution and increase the compatibility with the alkali-soluble resin. The dispersant is, for example, a cationic, anionic, or nonionic surfactant, and preferably a polymeric dispersant.

The photosensitive composition of the invention further includes a photo-reactive amphipathic molecule as a pigment modifier. The photo-reactive amphipathic molecule has the general formula: X-HB-HL, wherein X represents a photo-reactive group containing 1-6 unsaturated groups, HB represents a hydrophobic group, and HL represents a hydrophilic group. Ideally, the hydrophobic group HB provides good affinity to pigment such that the modifier is readily adsorbed on the surface of the pigment, while the hydrophilic group HL serves to increase the alkali developability of the photosensitive composition, thus preventing residue or scum in unexposed regions, and the photo-reactive group X serves to react with the resin in exposure regions to form a crosslinked polymer network, thereby producing a robust surface to prevent the film from being roughened or lost during development with the alkali developer. The photo-reactive amphipathic molecule is preferably present in an amount of 0.5-20 parts by weight, more preferably 0.5-10 parts by weight, based 100 parts by weight of the pigment.

According to the invention, the hydrophobic group HB may be either an aromatic or alkyl group containing 6 to 18 carbon atoms. Illustrative examples of such aromatic groups include, but are not limited to, phenyl, naphthalenyl, and anthracenyl groups, wherein naphthalenyl and anthracenyl are particularly preferred. Illustrative examples of such alkyl groups include, but are not limited to, hexyl, octyl, dodecyl, and octadecyl, wherein dodecyl and octadecyl are particularly preferred. The hydrophilic group HL of the photo-reactive amphipathic molecule may a hydroxyl group, a sulfonic group, and preferably a carboxyl group. The photo-reactive group X may contain one or more photo-reactive groups and preferably contain 1-3 ethylenically unsaturated groups such as acrylate or methacrylate.

The above photo-reactive amphipathic molecule may be prepared by reacting an aryl or alkyl anhydride with a hydroxyl-containing methacrylate or acrylate monomer. As an illustrative example, 10-30 parts by weight of aryl or alkyl anhydride is dissolved in 100 parts by weight of solvent, and an equivalent amount of hydroxyl-containing methacrylate or acrylate monomer is added for reaction for about 4 hours using 0.5-5 parts by weight of triethylamine as catalyst. The reaction temperature is preferably between 50-80° C., more preferably between 50-60° C.

In the preparation of the photo-reactive amphipathic molecule, examples of suitable solvents include tetrahydrofuran, methyl ethyl ketone, methyl isobutyl ketone, and cyclohexanone. Examples of suitable aryl anhydrides include phthalic anhydride, 1,8-naphthalic anhydride, and 1,9-anthracene dicarboxylic acid anhydride, wherein 1,8-naphthalic anhydride, and 1,9-anthracene dicarboxylic acid anhydride are particularly preferred. Examples of suitable alkyl anhydrides include adipic anhydride, suberic anhydride, sebacic anhydride, lauric anhydride, and stearic anhydride, wherein suberic anhydride, sebacic anhydride, and lauric anhydride are particularly preferred. Examples of suitable hydroxyl-containing methacrylate or acrylate monomers include mono-functional monomers such as 2-hydroxyl ethylmethacrylate, 2-hydroxyl propylmethacrylate, 2-hydroxyl butylmethacrylate, 2-hydroxyl ethylacrylate, 2-hydroxyl propylacrylate, and 2-hydroxyl butylacrylate; di-functional monomers such as pentaerythorytholdiarylate; and tri-functional monomers such as pentaerythorytholtriarylate.

The photosensitive composition of the invention is generally prepared as a liquid composition by adding a solvent. Any solvent can be properly selected for use as long as it dissolves or disperses the above components forming the photosensitive composition, does not react with these components, and exhibits appropriate volatility. Specific examples of the solvent include cyclohexanone, ethylene glycol ether, ethylene glycol monoethyl ether, ethylene glycol monobutyl ether, propylene glycol monomethyl ethyl acetate, and ethyl-2-ethoxyethyl acetate. These solvents may be used alone or in admixture of two or more.

Furthermore, the photosensitive composition of the invention may further include additives such as surfactants, dispersion aids, leveling agents, defoaming agents, adhesion accelerators, and the like, to improve the coating ability. These optional components and appropriate amounts are well known to those of skill in the art and, accordingly, will not be described herein in detail.

The solid content of the photosensitive composition of the invention may be altered by the choice of the coating methods and the desired film thickness, but is generally between about 10-40%. For example, for forming a 1-1.5 μm-thick film by spin coating, the solid content is preferably controlled at about 18-28%.

Preferable amounts of each components constituting the photosensitive composition of the invention are listed below.

| Component | Parts by weight |
| --- | --- |
| Alkali-soluble resin | 6-10 |
| Polyfunctional monomer | 3-10 |
| Photoinitiator | 0.5-5 |
| Pigment | 6-16 |
| Dispersant | 0.8-10 |
| Photo-reactive amphipathic molecule | 0.5-5 |
| Solvent | 60-90 |

The photosensitive composition may be prepared by first dispersing the pigment with a dispersant, adding the photo-reactive amphipathic molecule with thorough mixing, and then incorporating the remaining components at high speed stirring.

A method of forming a color filter using the photosensitive composition of the present invention will be described.

A photosensitive composition having a black pigment dispersed therein is coated on a substrate by, for example, spin coating, and the coated substrate is prebaked to evaporate the solvent. Thus, a coating film is formed. Thereafter, the coating film is exposed to radiation through a photomask and developed with an alkali developer to dissolve and remove unexposed portions of the coating film. The resulting coating film is then post-baked to form a black matrix to define portions for forming pixels.

Thereafter, photosensitive compositions with red, green, and blue pigments dispersed therein are coated on the substrate, which is then prebaked and exposed to radiation to form a coating film, which is then developed and post-baked in the same manner as previously described to form arrays of red, green, and blue pixels on the same substrate sequentially. Thus, a color filter having arrays of red, green and blue pixels arranged on the substrate is obtained.

The pre-bake is preferably at 60-110° C. for 0.5-5 minutes, and the post-bake is preferably 180-220° C. for 0.2-1 hours. The irradiation energy of the radiation is preferably 80 to 300 mJ/cm$^2$. The alkali developer is preferably an aqueous solution of sodium carbonate, sodium hydroxide, potassium hydroxide, or the like.

The color paste of the invention comprise a mixture of the pigment, the photo-reactive amphipathic molecule, and optionally the dispersant for the pigment. In producing a photosensitive composition, the color paste is dispersed in the photosensitive resin system using a dispersing machine such as a ball mill, a sand grinder, a three-roll mill, a high-speed impact mill and also general mixer.

Without intending to limit it in any manner, the present invention will be further illustrated by the following examples.

PREPARATIVE EXAMPLE 1

In a 250 ml three-neck reactor equipped with a stirring rod and a condenser, 25 g of 1,8-naphthalic anhydride was dissolved in 100 g of methyl ethyl ketone at 50° C. To the solution, 16.4 g of 2-hydroxy-ethyl-methacrylate, and 3 g of triethylamime as catalyst were added for reaction. After 4 hours, a photo-reactive amphipathic molecule was obtained with a solid content of 30.1%.

PREPARATIVE EXAMPLE 2

The same procedure as described in Preparative Example 1 was repeated except that the monofunctional 2-hydroxy-ethyl-methacrylate was replaced by 37.6 g of trifunctional pentaerythorytholtriacrylate. A photo-reactive amphipathic molecule was obtained with a solid content of 39.5%.

PREPARATIVE EXAMPLE 3

The same procedure as described in Preparative Example 1 was repeated except that 1,8-naphthalic anhydride was replaced by 31.3 g of 1,9-anthracene dicarboxylic acid anhydride. A photo-reactive amphipathic molecule was obtained with a solid content of 32.5%.

PREPARATIVE EXAMPLE 4

The same procedure as described in Preparative Example 1 was repeated except that 1,8-naphthalic anhydride was replaced by 33.6 g of lauric anhydride. A photo-reactive amphipathic molecule was obtained with a solid content of 34.0%.

PREPARATIVE EXAMPLE 5

Into a 1L four-neck reactor equipped with a stirring rod, a condenser, and a nitrogen inlet, 287.69 g of propylene glycol monomethyl ether acetate (PGMEA) was charged and heated to 90° C. To the reactor, which was maintained at 90° C., a solution containing 1.68 g of 2,2'-azobisisobutyronitrile (AIBN), 1.68 g of dodecanethi 177.62 g of benzylmethacrylate (BzMA), 38.33 g of methacrylic acid (MAA), and 29.51 g of 2-hydroxyethyl methacrylate (2-HEMA) in 82.92 g of PGMEA was added at a rate of about 3 cc/min. After the addition was completed within about 2-2.5 hours, the mixture was left stirring for additional one hour. Thus, a resin solution was obtained with a solid content of 39.98%. The acid value of the solution was measured about 102.1.

EXAMPLE 1

In a 250 ml PE grinding jar charged with 125 ml of zirconium balls of 1 mm diameter, 25 g of carbon black (Dugussa, Special 4A), 85 g of PGMEA, and 12.5 g of dispersant BYK-163 (BYK Chemie, 45% active ingredient) were dispersed using a Red Devil mill for 4 hours. Next, 6.0 g of the photo-reactive amphipathic molecule of Preparative Example 1 was added, and the dispersing was continued for an additional 10 minutes. The zirconium balls were filtered off to obtain a pigment dispersion. The mean diameter of the particles in the dispersion was determined with a light scattering apparatus (Otsuka Elect. ELS-800) and the result is listed in Table 1.

The dispersion was placed in a 500 ml three-neck reactor, and under nitrogen atmosphere, a solution containing 20 g of the resin solution of Preparative Example 5, 6 g of dipentaerythritol hexaacrylate as polyfunctional monomer, 4.5 g of 2-benzyl-2-(dimethylamino)-1-[4-(4-morpholinyl)phenyl]-1-butanone as photoinitiator, and 0.5 g of isopropylthioxanthone as photoinitiator in 96.7 g of PGMEA was added thereto. The mixture was stirred for 2 hours after the addition was completed, thus obtaining a photosensitive resin composition for black matrix.

The photosensitive resin composition was spin-coated onto a glass substrate, which was spun at 600 rpm for 15 seconds and then ramped to a final spin speed of 900 rpm for 20 seconds. After pre-baking at 90° C. for 2 minutes, the thickness of the coating film was measured as "F0". Thereafter, the substrate was exposed to 150 mJ/cm$^2$ of ultraviolet light through a photomask, immersed in a 0.5% KOH aqueous solution for development, washed with water and dried. The thickness of the developed film was measured as "F1". Next, the substrate was further post-baked at 230° C. for 1 hour, thus obtaining a black matrix on the glass substrate.

The developability was evaluated through an 100X optical microscope. The developability of the unexposed portions was evaluated as "Good" if no scum was seen, "Moderate" if only a few stains (less than 1 µm in diameter) were observed, "Poor" if stains of more than 1 µm in diameter were present, and "Bad" if the unexposed portion was not removed. The optical density of the black matrix was also measured as an indication of surface roughness. A higher optical density indicates a lower surface roughness. The results of measurements and the evaluated developability are listed in Table 1, wherein the comparison of F1 to F0 indicates the film resistance to the alkali developer at exposed portions.

EXAMPLE 2

The same procedure as described in Example 1 was repeated except that the photo-reactive amphipathic molecule was replaced by 4.8 g of that of Preparative Example 2. The results of measurements and the evaluated developability are listed in Table 1.

EXAMPLE 3

The same procedure as described in Example 1 was repeated except that the photo-reactive amphipathic molecule was replaced by 5.8 g of that of Preparative Example 3. The results of measurements and the evaluated developability are listed in Table 1.

EXAMPLE 4

The same procedure as described in Example 1 was repeated except that the photo-reactive amphipathic molecule was replaced by 5.79 of that of Preparative Example 4. The results of measurements and the evaluated developability are listed in Table 1.

EXAMPLE 5

The same procedure as described in Example 1 was repeated except that the carbon black was replaced by 25 g of pigment red 254(from Ciba), and the dispersant was replaced by 10.0 g of BYK-2001 (BYK Chemie, 52% active ingredient). The results of measurements and the evaluated developability are listed in Table 1.

EXAMPLE 6

The same procedure as described in Example 1 was repeated except that the carbon black was replaced by 25 g of Pigment Green 36 (from BASF), and the dispersant was replaced by BYK-2150 (BYK Chemie, 52% active ingredient) The results of measurements and the evaluated developability are listed in Table 1.

EXAMPLE 7

The same procedure as described in Example 1 was repeated except that the carbon black was replaced by 25 g of pigment blue 15:6(from BASF), and the dispersant was replaced by 10.0 g of BYK-2150 (BYK Chemie, 52% active ingredient). The results of measurements and the evaluated developability are listed in Table 1.

COMPARATIVE EXAMPLE 1

The same procedure as described in Example 1 was repeated except that no photo-reactive amphipathic molecule was added.

COMPARATIVE EXAMPLE 2

The same procedure as described in Example 1 was repeated except that the photo-reactive amphipathic molecule was replaced by 1.5 g of naphthalene acetic acid, which was non-photoractive.

COMPARATIVE EXAMPLE 3

The same procedure as described in Example 1 was repeated except that the photo-reactive amphipathic molecule was replaced by 1.6 g of anthracene carboxylic acid, which was non-photoractive.

TABLE 1

| | Particle size developability (µm) | | F1/F0 (µm/µm) | Optical density (OD/µm) |
|---|---|---|---|---|
| Example 1 | 0.135 | Good | 1.40/1.45 | 3.12 |
| Example 2 | 0.141 | Good | 1.51/1.54 | 3.23 |
| Example 3 | 0.122 | Good | 1.38/1.43 | 3.25 |
| Example 4 | 0.150 | Moderate | 1.48/1.56 | 2.95 |
| Example 5 | 0.102 | Good | 1.29/1.35 | — |
| Example 6 | 0.134 | Moderate | 1.36/1.46 | — |
| Example 7 | 0.115 | Good | 1.30/1.38 | — |
| Comparative Example 1 | 0.195 | Bad | 1.42/1.6 | 2.75 |
| Comparative Example 2 | 0.152 | Good | 0.8/1.48 | 2.0 |
| Comparative Example 3 | 0.156 | Good | 0.9/1.54 | 2.2 |

As can be seen from Table 1, the films formed from the photosensitive composition of the invention showed good developability at unexposed portions, and improved resistance to the alkali developer and lower surface roughness at exposed portions, as compared to that of Comparative Examples.

While the invention has been described by way of example and in terms of preferred embodiment, it is to be understood that the invention is not limited thereto, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A photosensitive resin composition, comprising
a photosensitive resin system;
a pigment;
a photo-reactive amphipathic molecule; and
a solvent;
wherein the photo-reactive amphipathic molecule has the formula:

X-HB-HL wherein, X represents a photo-reactive group containing 1-6 unsaturated groups, HB represents a naphthalenyl or anthracenyl group, and HL represents a hydrophilic group.

2. The composition as claimed in claim 1, wherein the photosensitive resin system comprises an alkali-soluble resin.

3. The composition as claimed in claim 2, wherein the alkali-soluble resin is a copolymer of an ethylenically unsaturated monomer and an acrylic monomer.

4. The composition as claimed in claim 2, wherein the photosensitive resin system further comprises a polyfunctional monomer.

5. The composition as claimed in claim 4, wherein the polyfunctional monomer has at least two polymerizable ethylenically unsaturated bonds in the molecule.

6. The composition as claimed in claim 4, wherein photosensitive resin system further comprises a photoinitiator.

7. The composition as claimed in claim 6, the photoinitiator has the maximum absorption at below 400 nm.

8. The composition as claimed in claim 1, wherein HL represents a carboxyl group, a hydroxyl group, or a sulfonic group.

9. The composition as claimed in claim 1, wherein X represents a photo-reactive group containing 1-3 ethylenically unsaturated groups, and HL represents a carboxyl group.

10. The composition as claimed in claim 1, wherein the photo-reactive amphipathic molecule is present in an amount of 0.5-20 parts by weight based 100 parts by weight of the pigment.

* * * * *